(12) United States Patent
Nishioka

(10) Patent No.: US 11,037,843 B2
(45) Date of Patent: Jun. 15, 2021

(54) APPARATUSES AND METHODS FOR TSV RESISTANCE AND SHORT MEASUREMENT IN A STACKED DEVICE

(71) Applicant: MICRON TECHNOLOGY, INC., Boise, ID (US)

(72) Inventor: Naohisa Nishioka, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/654,936

(22) Filed: Oct. 16, 2019

(65) Prior Publication Data
US 2020/0051876 A1 Feb. 13, 2020

Related U.S. Application Data

(62) Division of application No. 15/715,504, filed on Sep. 26, 2017, now Pat. No. 10,468,313.

(51) Int. Cl.
| | |
|---|---|
| *H01L 21/66* | (2006.01) |
| *H01L 23/48* | (2006.01) |
| *H01L 25/065* | (2006.01) |
| *H01L 25/00* | (2006.01) |
| *G01R 31/28* | (2006.01) |

(52) U.S. Cl.
CPC .......... *H01L 22/34* (2013.01); *G01R 31/2853* (2013.01); *G01R 31/2884* (2013.01); *H01L 22/14* (2013.01); *H01L 23/481* (2013.01); *H01L 25/0657* (2013.01); *H01L 25/50* (2013.01); *H01L 2225/06513* (2013.01); *H01L 2225/06544* (2013.01); *H01L 2225/06596* (2013.01)

(58) Field of Classification Search
CPC ....... H01L 22/34; H01L 22/14; H01L 23/481; H01L 25/50; H01L 25/0657; G01R 31/2853; G01R 31/2884
USPC .......................................................... 257/48
See application file for complete search history.

(56) References Cited

U.S. PATENT DOCUMENTS

| | | | |
|---|---|---|---|
| 9,929,127 B1 | 3/2018 | Walker | |
| 2010/0013512 A1* | 1/2010 | Hargan | G11C 29/022 324/762.02 |
| 2011/0057819 A1 | 3/2011 | Ide et al. | |
| 2011/0084758 A1 | 4/2011 | Shibata et al. | |
| 2011/0087811 A1 | 4/2011 | Kondo et al. | |
| 2011/0093224 A1 | 4/2011 | Ide et al. | |
| 2011/0110065 A1* | 5/2011 | Foster, Sr. | H01L 25/0657 361/803 |
| 2012/0163413 A1* | 6/2012 | Kim | G01K 13/10 374/152 |
| 2012/0212272 A1 | 8/2012 | Yokou et al. | |

(Continued)

*Primary Examiner* — Igwe U Anya
(74) *Attorney, Agent, or Firm* — Dorsey & Whitney LLP

(57) ABSTRACT

Examples described herein include apparatuses and methods TSV resistance and short measurement in a stacked device. An example apparatus may include a chip comprising semiconductor substrate including a first surface and a second surface opposite to the first surface. The chip may include a first terminal formed above the first surface, a second terminal formed above the second surface, a buffer circuit coupled between the first and second terminals, a first through-substrate via (TSV) penetrating the semiconductor substrate, and a first switch coupled between the first terminal and the first TSV.

18 Claims, 12 Drawing Sheets

(56) References Cited

U.S. PATENT DOCUMENTS

| | | | |
|---|---|---|---|
| 2013/0153896 A1* | 6/2013 | Whetsel | H01L 25/0657 257/48 |
| 2014/0340113 A1 | 11/2014 | Tseng et al. | |
| 2015/0213860 A1 | 7/2015 | Narui et al. | |
| 2017/0286000 A1 | 10/2017 | Ito et al. | |
| 2019/0096776 A1 | 3/2019 | Nishioka | |
| 2020/0051876 A1* | 2/2020 | Nishioka | G11C 29/1201 |

\* cited by examiner

| Times | | 1 | | 2 | | 3 | | 4 | | Resistance Test Upper 1 | | 2 | | 3 | | 4 | | Resistance Test Lower 1 | | 2 | | 3 | | 4 | | Short Test 1 | | 2 | | 3 | | 4 | |
|---|---|---|---|---|---|---|---|---|---|---|---|---|---|---|---|---|---|---|---|---|---|---|---|---|---|---|---|---|---|---|---|---|
| | | Core7 | 0th | Core6 | 0th | Core5 | 0th | Core4 | 0th | Core7 | 0th | Core6 | 0th | Core5 | 0th | Core4 | 0th | Core7 | 0th | Core6 | 0th | Core5 | 0th | Core4 | 0th | Core7 | 0th | Core6 | 0th | Core5 | 0th | Core4 | 0th |
| UPPER CORE | FCS | ON | OFF | ON | OFF | ON | OFF | ON | OFF | OFF | ON | OFF | ON | OFF | ON | OFF | ON | OFF | ON | OFF | ON | OFF | ON | OFF | ON | ON | OFF | ON | OFF | ON | OFF | ON | OFF |
| | SCS | ON | OFF | ON | OFF | ON | OFF | ON | ON | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF |
| | FFBCS | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | ON | OFF | ON | OFF | ON | OFF | ON |
| | SFBCS | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF |
| LOWER CORE | FCS | Core3 | 0th | Core2 | 0th | Core1 | 0th | Core0 | 0th | Core3 | 0th | Core2 | 0th | Core1 | 0th | Core0 | 0th | Core3 | 0th | Core2 | 0th | Core1 | 0th | Core0 | 0th | Core3 | 0th | Core2 | 0th | Core1 | 0th | Core0 | 0th |
| | | OFF | OFF | OFF | OFF | OFF | OFF | OFF | OFF | OFF | ON | OFF | ON | OFF | ON | OFF | ON | ON | OFF | ON | OFF | ON | OFF | ON | OFF | ON | OFF | ON | OFF | ON | OFF | ON | OFF |
| | SCS | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF |
| | FFBCS | ON | OFF | ON | OFF | ON | OFF | ON | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF |
| | SFBCS | ON | OFF | ON | OFF | ON | OFF | ON | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF | OFF |
| IF FB CIRCUIT | IFFFBCS<3> | OFF | | | | | | | | OFF | | | | | | | | OFF | | | | | | | | OFF | | | | | | | |
| | IFSFBCS<3> | OFF | | | | | | | | OFF | | | | | | | | OFF | | | | | | | | OFF | | | | | | | |
| | IFFFBCS<2> | OFF | | | | | | | | OFF | | | | | | | | OFF | | | | | | | | OFF | | | ON | | | | |
| | IFSFBCS<2> | OFF | | | | | | | | OFF | | | | | | | | OFF | | | | | | | | OFF | | | | | | | |
| | IFFFBCS<1> | OFF | | | | | | | | OFF | | | | | | | | OFF | | | | | | | | OFF | | | | | ON | | |
| | IFSFBCS<1> | OFF | | | | | | | | OFF | | | | | | | | OFF | | | ON | | | | | OFF | | | | | | | |
| | IFFFBCS<0> | OFF | | | | | | | | OFF | | | | | | | | OFF | | | | | ON | | | OFF | | | | | | | |
| | IFSFBCS<0> | OFF | | | | | | | | OFF | | | | | | | | OFF | | | | | | | | OFF | | | | | | | ON |

APPARATUSES AND METHODS FOR TSV RESISTANCE AND SHORT MEASUREMENT IN A STACKED DEVICE

CROSS-REFERENCE TO RELATED APPLICATION(S)

This application is a divisional of U.S. patent application Ser. No. 15/715,504, filed Sep. 26, 2017 and issued as U.S. Pat. No. 10,468,313 on Nov. 5, 2019. These application and patent are incorporated by reference herein in their entirety and for all purposes.

BACKGROUND

Historically, during manufacture of stacked circuit configuration, testing for conduction failures through throughsubstrate vias (TSVs) between layers of the circuit was limited to physical inspection. Being limited to physical inspection made it impossible to make an assessment to improve screen yield related to the TSV. For example, being limited to physical inspection prevents adoption of an electric non-destructive analysis for a screen test and defect assessment/analysis, which includes identifying defective areas and examining origins of failure modes.

BRIEF DESCRIPTION OF THE DRAWINGS

FIG. 11 is an exemplary table of values of the control signals based on the logic circuits of FIG. 10 in accordance with embodiments of the disclosure

DETAILED DESCRIPTION

Certain details are set forth below to provide a sufficient understanding of embodiments of the present disclosure. However, it will be clear to one skilled in the art that embodiments of the present disclosure may be practiced without various of these particular details. In some instances, well-known wireless communication components, circuits, control signals, timing protocols, computing system components, telecommunication components, and software operations have not been shown in detail in order to avoid unnecessarily obscuring the described embodiments of the present disclosure.

Figure 1:
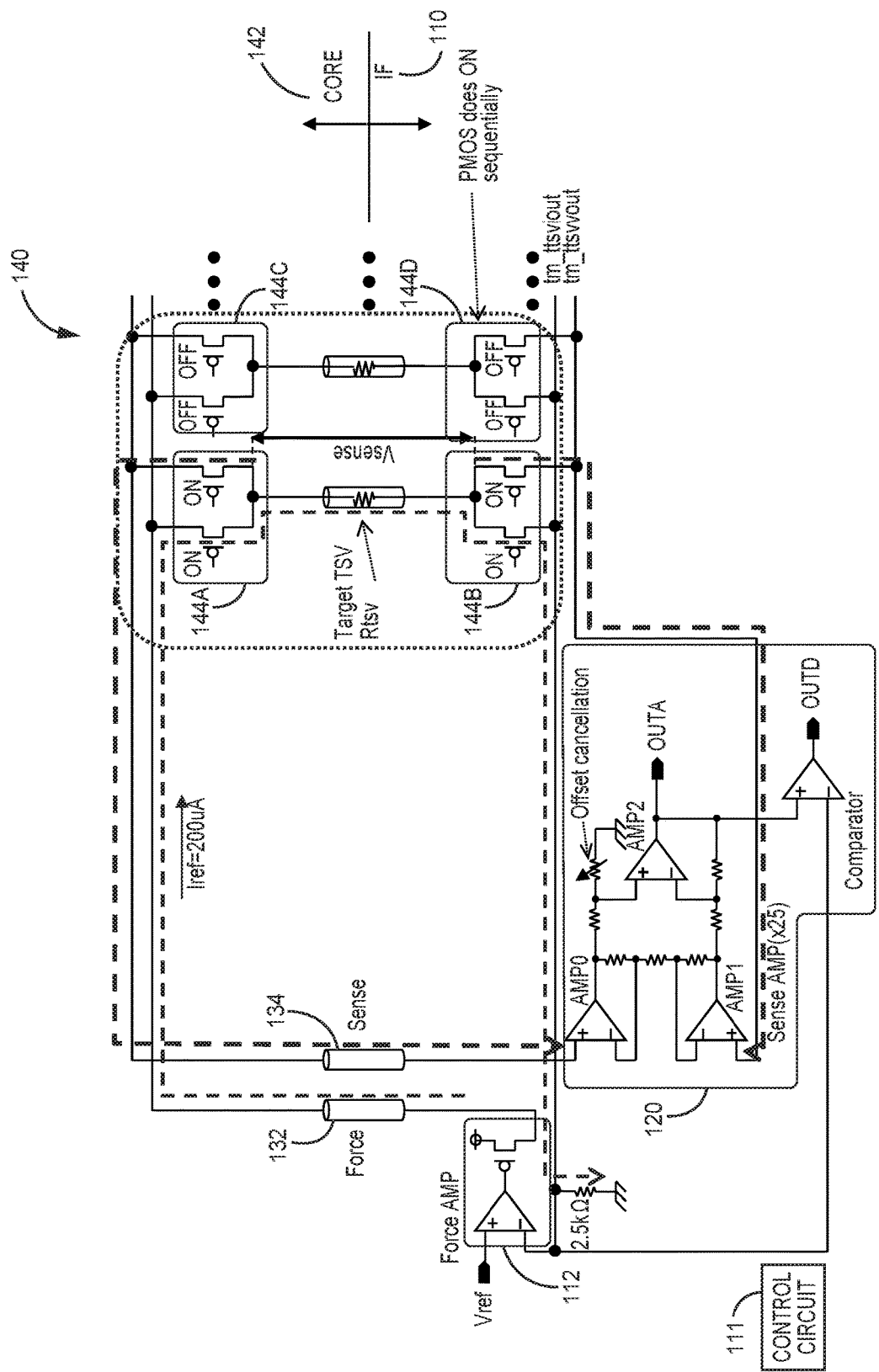
FIG. 1 is a prior art schematic illustration of an apparatus including a stacked semiconductor device in accordance with embodiments of the disclosure.

FIG. 1 is a schematic illustration of an apparatus 100 including a stacked semiconductor device in accordance with embodiments of the disclosure. The apparatus 100 may include an interface chip 110 and a stacked semiconductor device 140. The interface chip 110 may include a control circuit 111, a force signal driver 112, and an output circuit 120. The control circuit 111 provides control signals to circuitry of the stacked semiconductor device 140. The output circuit 120 may include amplifier circuits AMP0, AMP1, AMP2, and a CMP circuit to compare voltages of a sense signal and a sense feedback signal and provide an analog output signal OUTA and a digital output signal OUTD that are indications of resistance of the 146 or the 147. The OUTA signal may provide an indication of actual resistance and the OUTD signal may provide an indication as to whether the resistance of the 146 or the 147 exceeds a threshold (e.g., 100 ohms or some other value).

The stacked semiconductor device 140 may include a core chip 142. While the stacked semiconductor device 140 is depicted with only a single core chip, other core chips may be stacked on the single core chip without departing from the scope of the disclosure. The core chip 142 and the interface chip 110 may include first control circuitry 144A and 144B, respectively, to control resistance testing of the 146 and may include second control circuitry 144C and 144D, respectively, to control resistance testing of the 147. Additional sets of control circuitry and TSVs in parallel with the sets control circuitry 144A/144B/146 and control circuitry 144C/144D/147 sets may be included on the core chip 142 and the interface chip 110 without departing from the scope of the disclosure. The control circuitry 144A may provide a sense signal having a voltage from a first end of the 146 to the output circuit 120 and the control circuitry 144B may provide the sense feedback signal having a voltage from a second end of the 146 to the output circuit 120. The control signals for the control circuitry 144A-144D may be provided by the control circuit 111 of the interface chip 110. The core chip 142 may further include a TSV 132 and TSV 134 to provide a force signal to the control circuitry 144A and to provide the sense signal from the control circuitry 144A.

In an operation testing resistance of the 146, the force signal driver 112 may provide a force signal having a constant current through the TSV 132 to the 144A and to circuitry of the stacked semiconductor device 140. The constant current is controlled by the force AMP of the force signal driver 112 based on a comparison between the VREF signal and the force feedback signal. The control circuit 111 may provide control signals to the control circuits 144A and 144B to enable the respective p-type metal oxide semiconductor (MOS) transistors. With the control circuitry 144A and 144B enabled, force signal is provided to the 146 via one enabled p-type MOS transistor of the control circuitry 144A. Current flows through the 146 to the second end. The force feedback signal is provided at one output of the control circuitry 144B one enabled p-type MOS transistor of the control circuitry 144B to the force AMP of the force signal driver 112. The sense signal is provided via one enabled p-type MOS transistor of the control circuitry 144A through the TSV 134 to the output circuit 120. A sense feedback signal is provided through one enabled p-type MOS transistor of the control circuitry 144B to the output circuit 120. The AMP0, AMP1, and AMP2 circuits may compare the sense and sense feedback signals to determine a voltage difference. The voltage difference between the sense and sense feedback signals provided in the OUTA signal from the output of the AMP2 circuit may indicate a resistance of the 146. The OUTA signal may be compared with the force feedback signal to indicate whether the resistance of the 146 exceeds a threshold, such as 100 ohms. Due to sensitivity of the circuitry to small resistance differences, an offset cancellation resistor maybe provided to account for line loss caused by different conductive path lengths for the sense and sense feedback signals.

Figure 2:
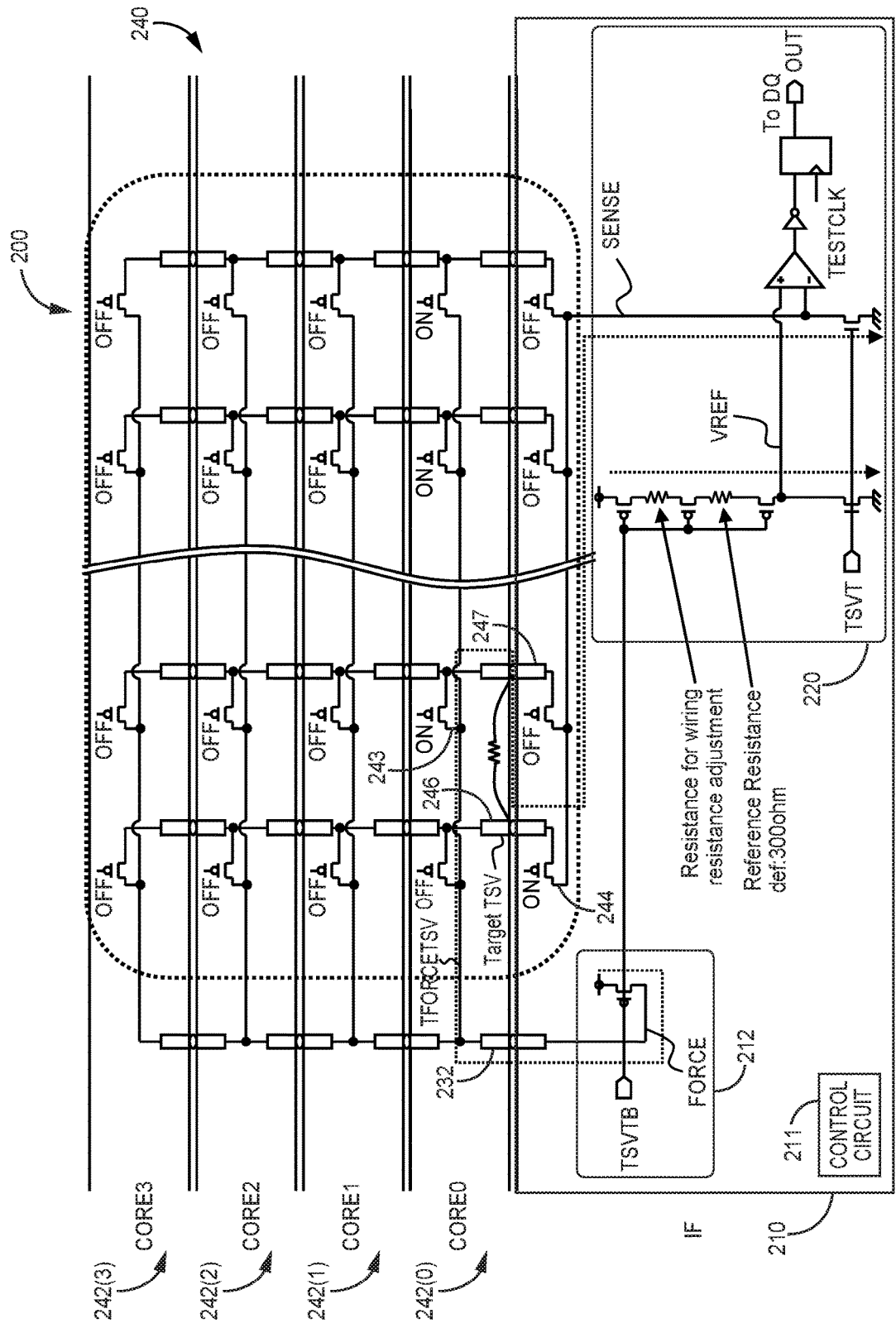
FIG. 2 is a prior art schematic illustration of an apparatus including a stacked semiconductor device in accordance with embodiments of the disclosure.

FIG. 2 is a schematic illustration of an apparatus 200 including a stacked semiconductor device in accordance with embodiments of the disclosure. The apparatus 200 may include an interface chip 210 and a stacked semiconductor device 240. The interface chip 210 may include a control circuit 211, a force signal driver force signal driver 212, and an output circuit 220. The control circuit 211 provides control signals to circuitry of the stacked semiconductor device 240. The output circuit 220 may include comparator and latch circuits to compare voltages of sense signal with a voltage reference signal VREF and to latch a result of the comparison as an output signal OUT in response to a test clock signal TESTCLK. The output circuit 220 may include a series of serially-coupled transistors separated by resistances that are used to provide the VREF signal. The resistances and transistors may transistors be selected to compensate for line loss as the force and sense signals propagate through the stacked semiconductor device 240 during testing. The interface chip 210 further includes a row of p-type MOS transistors (e.g., the transistor 244) that selectively couple a TSV (e.g., the 246) to the output circuit 220 during a test.

The stacked semiconductor device 240 may include core chips 0-3 242(0-242(3). Each of the core chips 0-3 242(0-242(3) may include rows of TSVs providing connections between the cores, such as the 232, the 246, and the 247 of the core chip 0 242(0). Each core chip may have a similar layout and structure. While the stacked semiconductor device 140 is depicted with 4 cores, additional core chips may be stacked onto the 4 core chips without departing from the scope of the disclosure. Each of the core chips may also include p-type MOS transistors (e.g., the transistor 243) that selectively couple a TSV (e.g., the 247) to the force signal from the force signal driver force signal driver 212.

In an operation testing whether there is a short between the 246 and the 247, the force signal driver force signal driver 212 may provide a force signal through the 232 to the 243 of the core chip 0 242(0). The control circuit 211 may provide control signals to enable the respective p-type MOS transistors 243 and 244. With the respective p-type MOS transistors 243 and 244 enabled, the force signal is provided to the 247 via the enabled p-type MOS transistor 243. If there is a short between the 246 and the 247, current will flow from the 247, through the 246 and the respective p-type MOS transistor 244 to the output circuit 220 via the sense signal. If there is no short between the 246 and the 247, then no current would flow to the output circuit 220 via the sense signal. The output circuit 220 may compare a voltage of the sense signal with the VREF voltage to determine whether there is a short. The OUT signal is provided from an output of the latch of the output circuit 220 based on the comparison and in response to the TESTCLK signal.

As shown in FIGS. 1 and 2, the circuitry is able to test for resistance and shorts to detect defects in TSVs of the stacked semiconductor device 140 and the stacked semiconductor device 240. However, the implementations of the control circuitry 144A-144D and 243, and 244 in the stacked semiconductor device 140 and the stacked semiconductor device 240, respectively, require a complete set of additional control circuitry for each additional TSV, and additional circuitry in the output circuit 120 and the output circuit 220 to account for differences in propagation distances of signals. With space constraints become tighter and signal frequencies becoming higher, a better solution may include reusing common circuitry and arranging circuitry to make propagation distances similar or equal.

Figure 3:
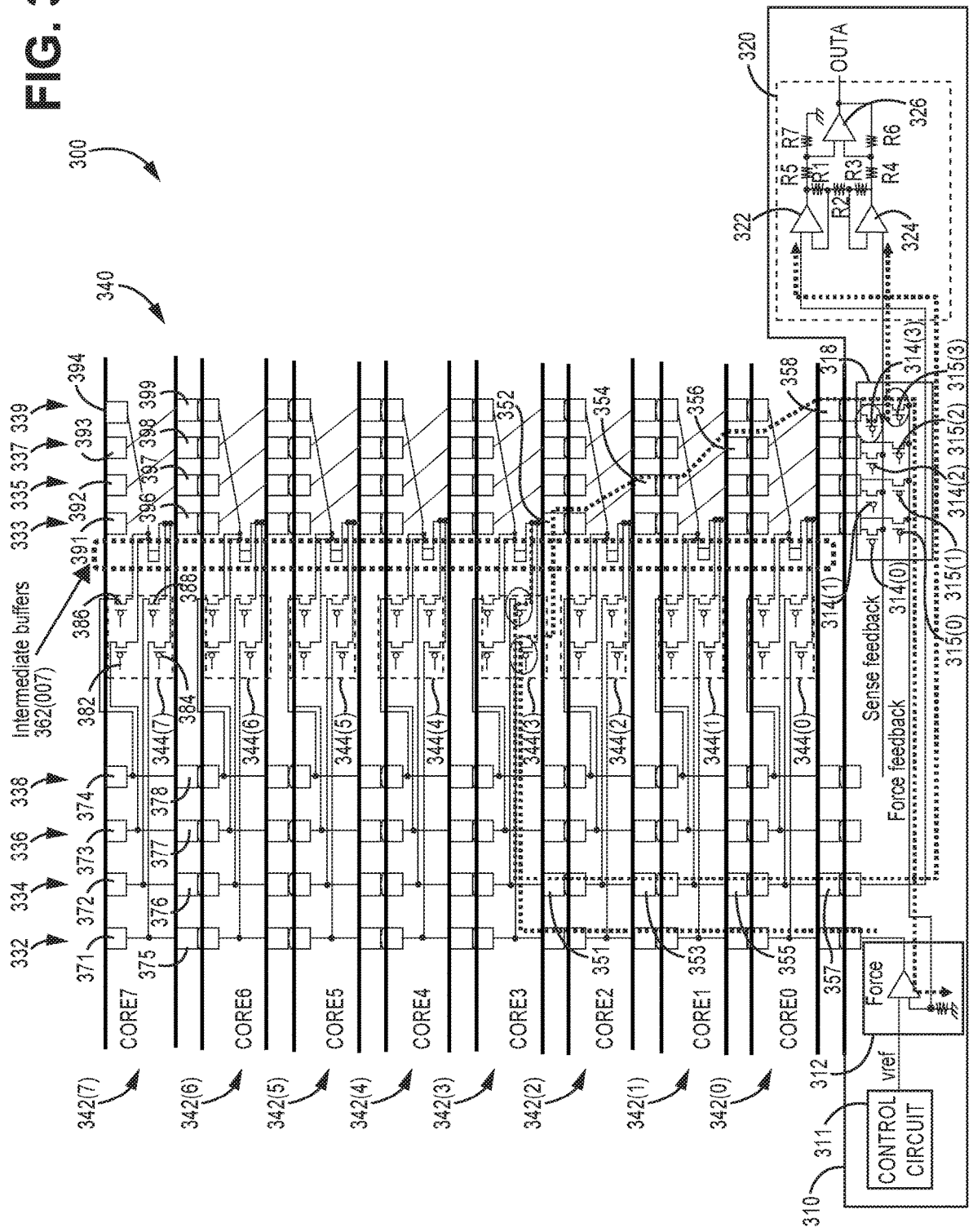
FIG. 3 is a schematic illustration of an apparatus including a stacked semiconductor device in accordance with embodiments of the disclosure.

FIG. 3 is a schematic illustration of an apparatus 300 including a stacked semiconductor device in accordance with embodiments of the disclosure. The apparatus 300 may include an interface chip 310 and a stacked semiconductor device 340. The interface chip 310 may include a control circuit 311, a force signal driver 312, interface chip switch circuit 313, and an output circuit 320. The control circuit 311 provides control signals to the interface chip switch circuit 313 and to circuitry of the stacked semiconductor device 340. The output circuit 320 may include amplifier circuits 322, 324, 326 and resistances R1-R5 to compare voltages of a sense signal and a sense feedback signal and provide an analog output signal OUTA. The OUTA signal may provide an indication of actual resistance of target terminal connections 352, 354, 356, 358.

The stacked semiconductor device 340 may include core chips 0-7 342(0-242(7). Each of the core chips 0-7 342(0-242(7) may include a respective buffer circuit 362(0)-362(7) and respective control circuitry 344(0)-344(7). Each of the core chips 0-7 342(0-242(7) may further include rows of terminals providing connections between the cores chips 0-7 342(0-242(7). The TSVs aligned between the core chips 0-7 342(0-242(7) to form columns, such as the TSV columns 332, 334, 336, 338 on a first portion (e.g., left side) of the core chips 0-7 342(0-242(7) and the TSV columns 333, 335, 337, 339 on another portion (e.g., right side) of the core chips 0-7 342(0-242(7). The terminals along the TSV columns 332, 334, 336, 338 may be directly connected in a direct, aligned path through the core chips 0-7 342(0-242(7) to the interface chip 310. For example, in core chip 7 342(7), the terminal 371 is aligned with and connected to the terminal 375, the terminal 372 is aligned with and connected to the terminal 376, the terminal 373 is aligned with and connected to the terminal 377, and the terminal 374 is aligned with and connected to the terminal 378.

The terminals associated with the TSV columns 333, 335, 337, 339 may be connected in a spiral (e.g., staggered) structure such that the terminal connections are offset in one direction from one core chip to an adjacent core chip, with an outer most terminal coupled to an inner most terminal of a lower core chip via a respective buffer circuit 362(0)-362(7). For example, in core chip 7 342(7), the terminal 391 is connected to the terminal 397, the terminal 392 is and connected to the terminal 398, the terminal 393 is connected to the terminal 399 via the buffer circuit 362(7). The interface chip switch circuit 313 may include sense feedback transistors 314(0)-314(3) and force feedback transistors 315(0)-315(3). The sense feedback transistors 314(0)-314(3) and the force feedback transistors 315(0)-315(3) are each connected to between the output circuit 320 and a TSV within the interface chip 310 along a respective one of the columns of TSVs 333, 335, 337.

The buffer circuits 362(0)-362(7) may control propagation of signals in one direction from a TSV of the TSV column 333 of one core chip to a TSV of the TSV column 339 of an above adjacent core, and may control propagation of signals in an opposite direction from a TSV of the TSV column 339 of one core chip to a TSV of the TSV column 333 of a below adjacent core. Typically, the buffer circuits 362(0)-362(7) may be enabled during normal operation and may be disabled during test of the TSVs of the TSV columns 333, 335, 337, 339. The control circuitry 344(0)-344(7) in each of the core chips may include p-type MOS transistors that are used during testing to perform testing of TSVs within the TSV columns 333, 335, 337, 339 for a total of four TSVs tested during a single test. For example, in core chip 7 342(7), the control circuitry 344(7) includes a force feedback transistor 382, a force transistor 384, a sense feedback transistor 386, and a sense transistor 388. The force feedback transistor 382 is coupled to a node between the terminal 373 and the terminal 377 and to a node between the 362(7) and the terminal 394. The force transistor 384 is coupled to a node between the terminal 371 and the terminal 375 and to a node between the 362(7) and the terminal 396. The sense feedback transistor 386 is coupled to a node between the terminal 374 and the terminal 378 and to a node between the 362(7) and the terminal 394. The sense transistor 388 is coupled to a node between the terminal 371 and the terminal 375 and to a node between the 362(7) and the terminal 396. The control circuitry 344(0)-344(6) of the other core chips 0-6 342(0)-342(6) may include the same corresponding transistors 382, 384, 386, and 388 that perform the same function as the transistors 382, 384, 386, and 388 of the control circuitry 344(7) of core chip 7 342(7). The terminal 391 is connected to the terminal 397, the terminal 392 is and connected to the terminal 398, the terminal 393 is connected to the terminal 399 via the buffer circuit 362(7).

FIG. 3 depicts an operation of testing four terminal connections 352, 354, 356, and 358 within the TSV columns 333, 335, 337, and 339, respectively, and in core chips 3-0 342(3)-342(0), respectively. During the test, the force signal driver force signal driver 312 may provide a force signal having a constant current through the TSV column 332. The control circuit 311 may disable the buffer circuits 362(0)-362(7) and may enable the force transistor 384 and the sense transistor 388 of the control circuitry 344(3) (e.g., core chip 3 342(3) transistors 384 and 388 are circled in the FIG. 3) of core chip 3 342(3) and the sense transistor 314(3) and the force transistor 315(3) of the interface chip switch circuit 313 (e.g., the sense transistor 314(3) and the force transistor 315(3) are circled in the FIG. 3). The buffer circuits 362(0)-362(7) may be disabled to prevent propagation of the force signal through terminals of the core chips 4-7 342(4)-342(7). The force signal may propagate through the TSV column 332, across core chip 3 342(3), through the force transistor 384 of the control circuitry 344(3), and through the terminal connections 352, 354, 356, and 358 of core chips 3-0 342(3)-342(0), respectively. The force feedback signal may propagate from the terminal 358 through the force transistor 315(3) to force signal driver force signal driver 312. The force feedback signal may be compared with a reference voltage signal VREF by the force signal driver force signal driver 312 to maintain a constant current on the force signal.

In response to the force signal, the sense signal may propagate from a node at one end of the terminal 352 through the sense transistor 388 of the control circuitry 344(3), across the core chip 3 342(3), and through terminals of the TSV column 334 of core chips 3-0 342(3)-342(0) and across the interface chip 310 to the output circuit 320. The sense feedback signal may flow from the TSV 358 through the sense transistor 314(3) to output circuit 320. Because of the routing of the sense/sense feedback signals and the force/force feedback signals, the propagation distances may be approximately equal, which may mitigate issues caused by different propagation distances. The amplifier 322 may compare the sense voltage with a divided output voltage of the amplifier 322 via the R1 resistance to provide a sense output voltage. The amplifier 324 may compare the sense voltage with a divided output voltage of the amplifier 324 via the R3 resistance to provide a sense feedback output voltage. The sense output voltage and the sense feedback voltages may be provided to inputs of the amplifier 326 via resistances R5 and R4, respectively. The amplifier 326 may provide an output signal OUTA based on the comparison. The OUTA signal may indicate a resistance through the terminal connections 352, 354, 356, and 358.

As shown in FIG. 3, rather than having separate, individual control circuitry for each TSV of the cores, the core chips 342(0)-342(7) may include a spiral structure in the TSV columns 333, 335, 337, 339, the control circuitry 344(0)-344(7), and the buffer circuits 362(0)-362(7) that allow for testing of a set of TSVs across a subset of the core chips 342(0)-342(7).

Figure 4:
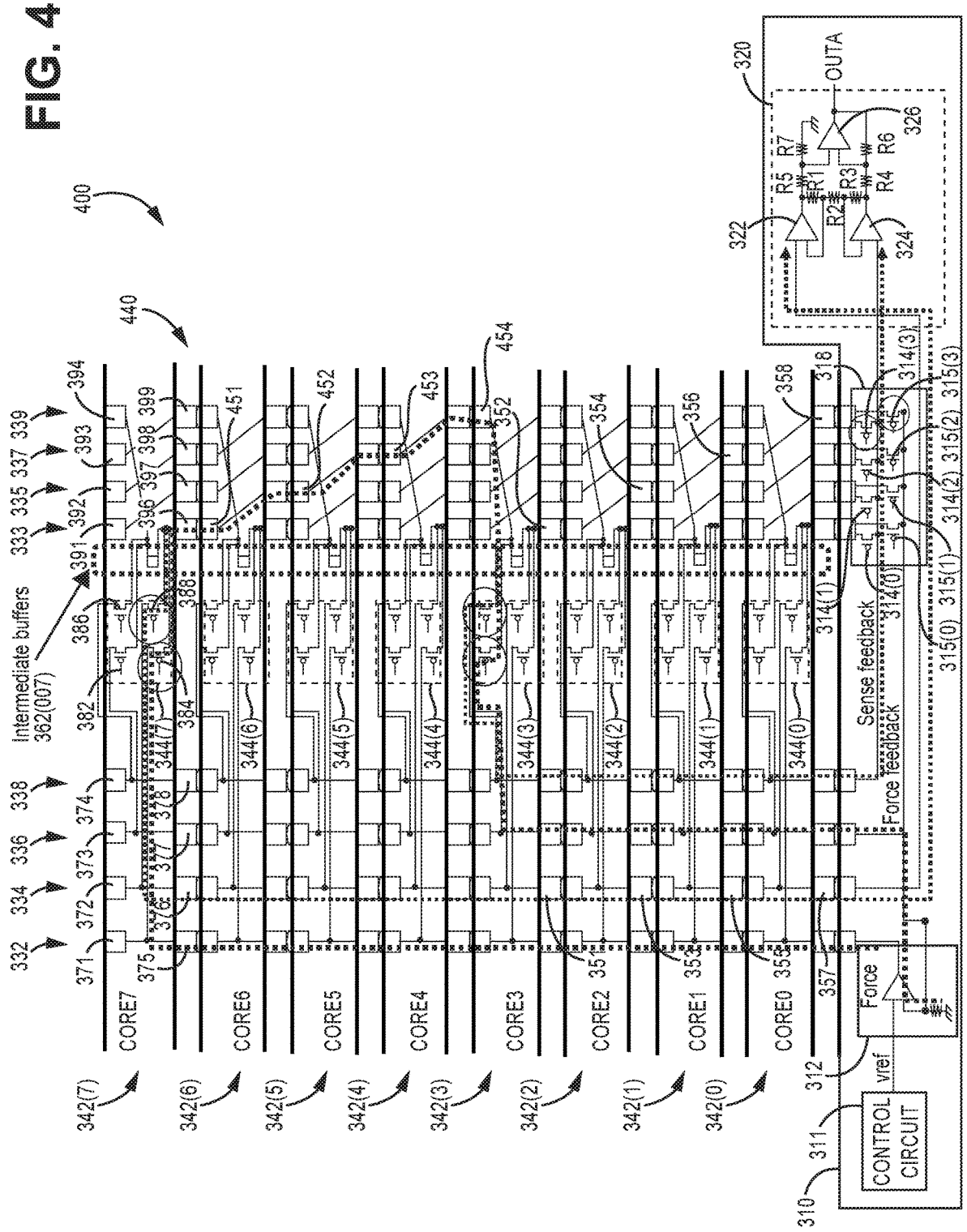
FIG. 4 is a schematic illustration of an apparatus including a stacked semiconductor device in accordance with embodiments of the disclosure.

FIG. 4 is a schematic illustration of an apparatus 400 including a stacked semiconductor device in accordance with embodiments of the disclosure. The apparatus 400 may include elements that have been previously described with respect to the apparatus 300 of FIG. 3. Those elements have been identified in FIG. 4 using the same reference numbers used in FIG. 3 and operation of the common elements is as previously described. Consequently, a detailed description of the operation of these particular elements will not be repeated in the interest of brevity.

FIG. 4 depicts an operation of testing four terminal connections 451, 452, 453, and 454 within the TSV columns 333, 335, 337, and 339, respectively, and in core chips 7-4 342(7)-342(4), respectively. During the test, the force signal driver force signal driver 312 may provide a force signal having a constant current through the TSV column 332. The control circuit 311 may disable the buffer circuits 362(0)-362(3) and may enable the force transistor 384 and the sense transistor 388 of the control circuitry 344(7) of core chip 7 342(7) and the force feedback transistor 382 and sense feedback transistor 386 of the control circuitry 344(3) of core chip 3 342(3). The buffer circuits 362(0)-362(7) may be disabled to prevent propagation of the force signal through TSVs of core chips 3-0 342(3)-342(0). The force signal may propagate through the TSV column 332, across core chip 7 342(7), through the force transistor 384 of the control circuitry 344(7), and through the terminal connections 451, 452, 453, and 454 of core chips 7-4 342(7)-342(4), respectively. The force feedback signal may propagate from the terminal connection 454 through the force feedback transistor 382 of the control circuitry 344(3), across the core chip 3 342(3), and through terminal connections of the TSV column 336 of core chips 3-0 342(3)-342(0) to the force signal driver force signal driver 312. The force feedback signal may be compared with a reference voltage signal VREF by the force signal driver force signal driver 312 to maintain a constant current on the force signal.

In response to the force signal, the sense signal may propagate from a node at one end of the TSV 451 through the sense transistor 388 of the control circuitry 344(7), across the core chip 7 342(7) and through terminal connections of the TSV column 334 of core chips 7-0 342(7)-342(0), and across the interface chip 310 to the output circuit 320. The sense feedback signal may propagate from the TSV 454 through the sense feedback transistor 386 of the control circuitry 344(3), across the core chip 3 342(3), and through TSVs of the TSV column 338 of core chips 3-0 342(3)-342 (0) to the output circuit 320. Because of the routing of the sense/sense feedback signals and the force/force feedback signals, the propagation distances may be approximately equal, which may mitigate issues caused by different propagation distances. The output circuit 320 may provide an output signal OUTA based on a comparison between the sense and sense feedback signals as described with reference to FIG. 3. The OUTA signal may indicate a resistance through the TSVs 352, 354, 356, and 358.

While FIGS. 3 and 4 depict testing specific terminal connections of the TSV columns 333, 335, 337, 339 of the core chips 0-7 342(0)-342(7), other terminal connections of the TSV columns 333, 335, 337, 339 of the core chips 0-7 342(0)-342(7) may be implemented using similar methods to control circuitry 344(0)-344(7) of other core chips and/or the interface chip switch circuit 313 to perform the testing.

Figure 5:
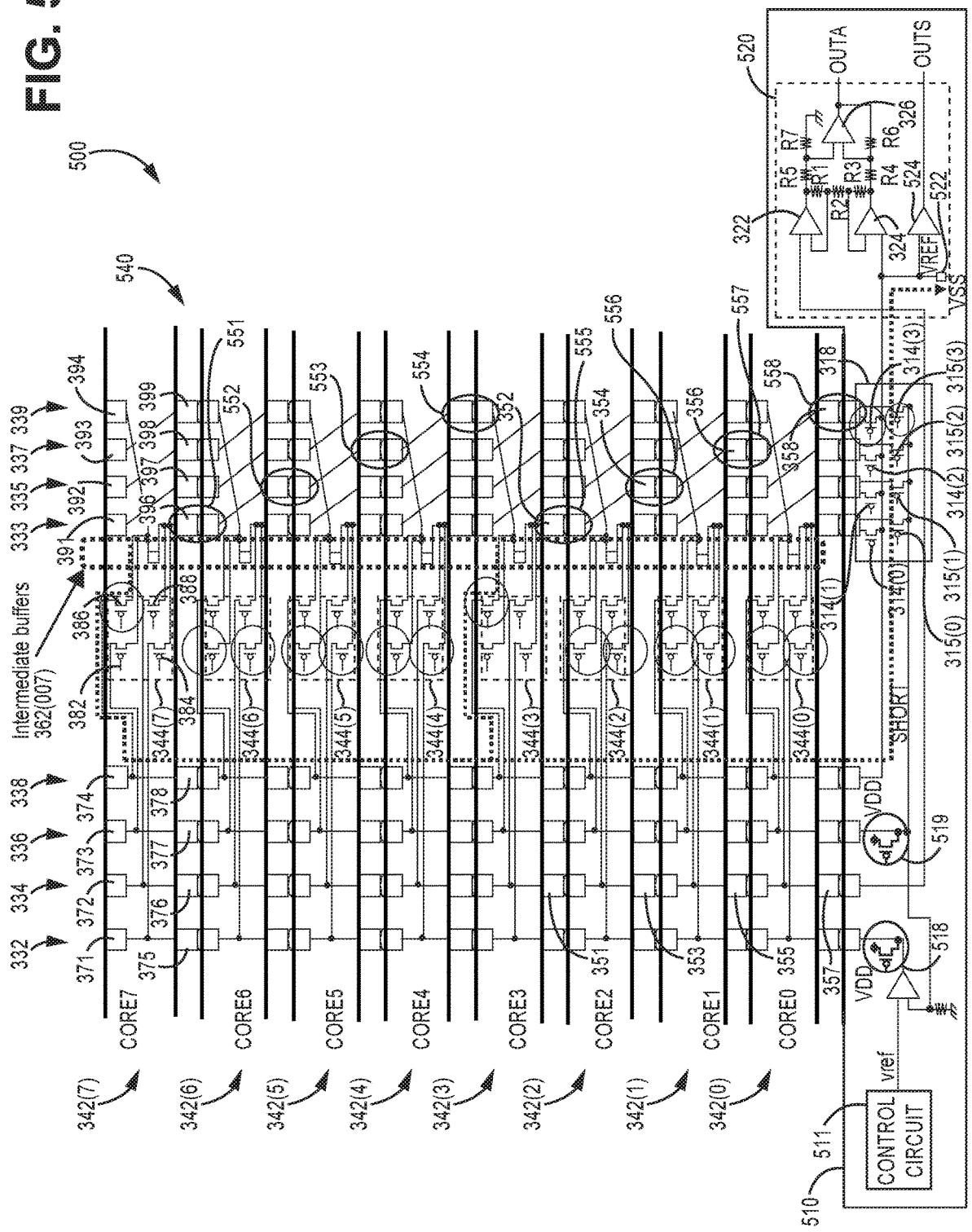
FIG. 5 is a schematic illustration of an apparatus including a stacked semiconductor device in accordance with embodiments of the disclosure.

FIG. 5 is a schematic illustration of an apparatus 500 including a stacked semiconductor device in accordance with embodiments of the disclosure. The apparatus 500 may include elements that have been previously described with respect to the apparatus 300 of FIG. 3. Those elements have been identified in FIG. 5 using the same reference numbers used in FIG. 3 and operation of the common elements is as previously described. Consequently, a detailed description of the operation of these particular elements will not be repeated in the interest of brevity. The interface chip 510 may include a control circuit 511, a force short transistor 518, a force short feedback transistor 519, and an output circuit 520. The force short transistor 518 and the force short feedback transistor 519 may drive a VDD voltage to the non-target terminals during a short test in response to a control signal. The output circuit 520, in addition to the amplifier 322, the amplifier 324, the amplifier 326, and resistances R1-R7 described with reference to FIG. 3, a transistor 522 configured to couple a short signal to ground and a comparator 524 configured to compare the short signal to a voltage reference signal VREF2 to determine whether any of the terminals of terminal connections 551-558 are shorted to adjacent terminals. The control circuit 511 may provide a control signal and the VREF2 to the transistor 522 and the comparator 524, respectively.

FIG. 5 depicts an operation to test eight terminal connections 551-558 within the TSV columns 333, 335, 337, and 339 of the core chips 0-7 342(0)-(7) for short circuits between adjacent terminals within the TSV columns 333, 335, 337, and 339. The terminal connections 551-558 may also be tested for a short to a ground voltage VSS. During the short to adjacent terminal test, the force short transistor 518 and the force short feedback transistor 519 may provide force and force feedback signals having VDD voltages through the TSV column 332 and the TSV column 336, respectively, in response to a control signal from the control circuit 311. The control circuit 311 may disable the buffer circuits 362(0)-362(7) and may enable the force feedback transistor 382 and the force transistor 384 of the control circuitry 344(0)-344(2) and 344(4)-344(6) of core chips 0-2 and 4-6 342(0)-342(2) and 342(4)-342(6), respectively. The control circuit 311 may also enable the sense feedback transistor 386 of the control circuitry 344(3) and 344(7) of the core chips 3 and 7 342(3) and 342(7), respectively. The control circuit 311 may also enable the sense transistor 314(3). The force signal and force feedback signals may propagate through all terminals of the TSV columns 333, 335, 337, and 339 except terminal connections 551-558.

The short signal may propagate through the terminal connections 551-558 to the output circuit 520 through the sense feedback transistor 386 of the control circuitry 344(3) and 344(7) and the TSV column 338 and through the sense transistor 314(3). The comparator 524 may compare the short signal to a voltage reference signal to determine any of the terminals of the terminal connections 551-558 are shorted to an adjacent terminal may cause the short signal to have a voltage higher than the reference voltage. Otherwise, the short signal voltage may be a low voltage signal.

In a second test, the control circuit 511 may disable the transistor 522, and may disable the force feedback transistor 382 and the force transistor 384 of the control circuitry 344(0)-344(7), enable the sense feedback transistor 386 of the control circuitry 344(3) and 344(7), enabled the force short transistor 518 and the force short feedback transistor 519 may provide force and force feedback signals having VDD voltages, and enable the sense transistor 314(3). This may precharge the terminals of the TSV columns 333, 335, 337, and 339 to the VDD voltage. The control circuit 511 may subsequently disable the force feedback transistor 382 and the force transistor 384 of the control circuitry 344(3) and 344(7), which may leave the terminal connections 551-558 in a floating state. The output circuit 520 may sense a voltage of the short signal after a predetermined time period. If the terminal connections 551-558 are shorted to a VSS source, the precharged voltage on the short signal will dissipate more quickly than if there is no short to a VSS source.

Figure 6:
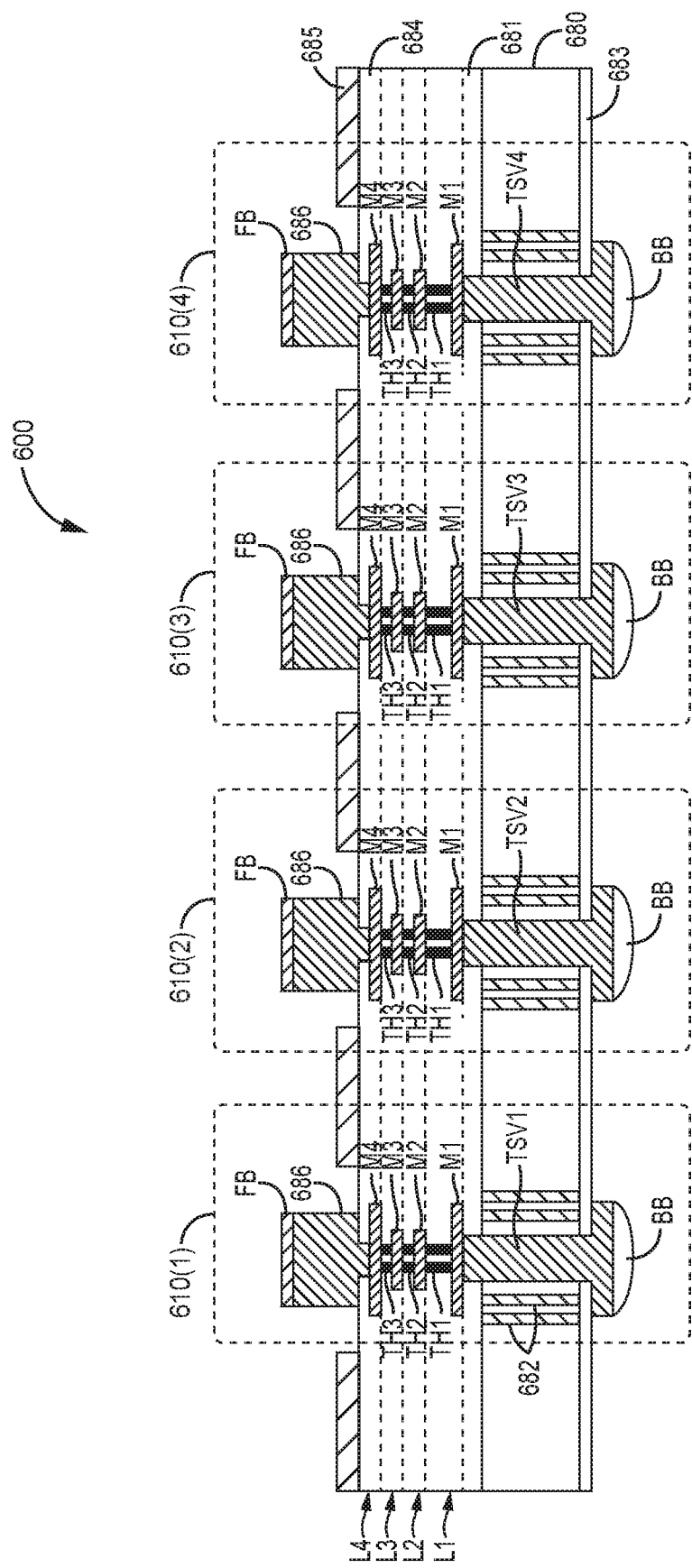
FIG. 6 is a cross-sectional view showing TSV structures according to embodiments of the disclosure.
Figure 7:
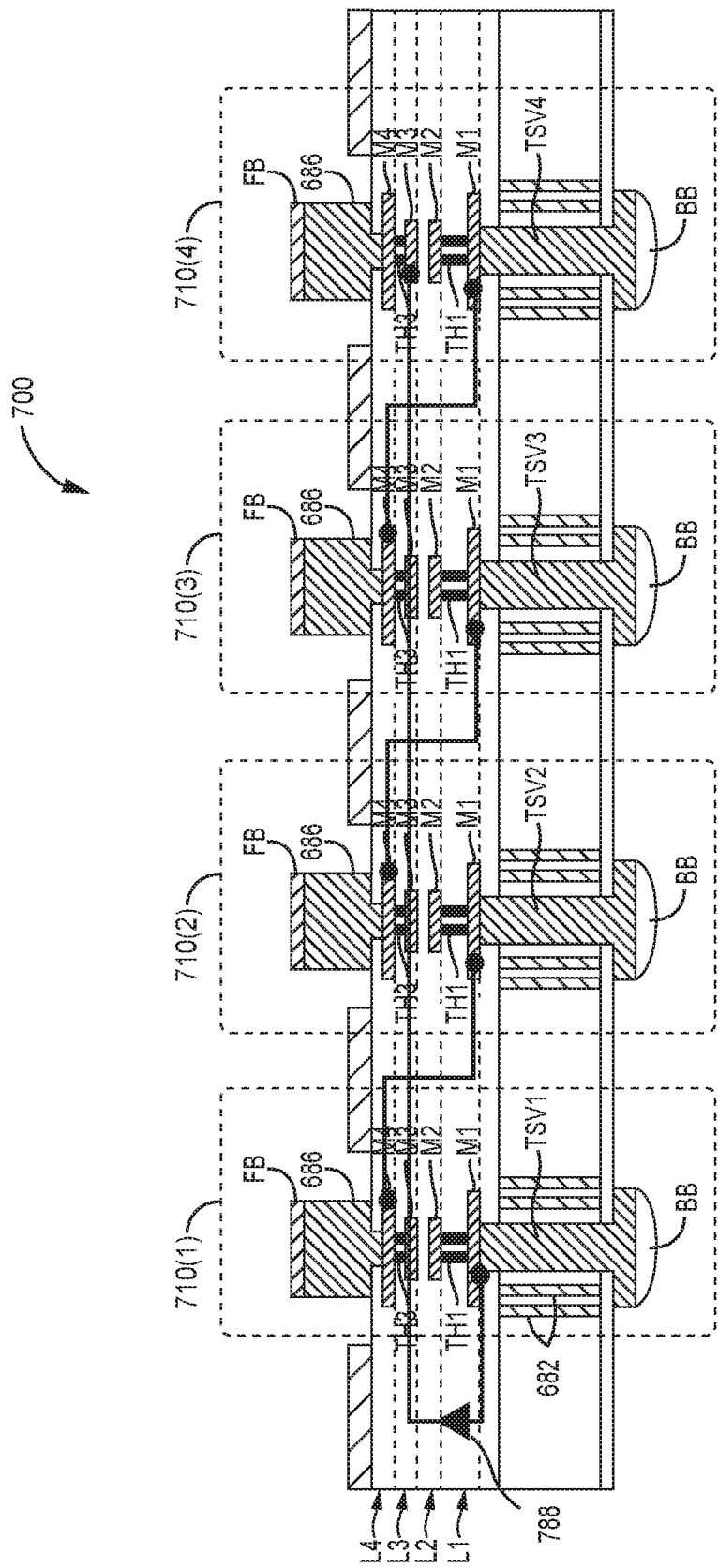
FIG. 7 is a cross-sectional view showing TSV structures according to embodiments of the disclosure.

FIG. 6 and FIG. 7 are cross-sectional views 600 and 700 showing the TSV structures according to embodiments of the disclosure. In some examples, the TSV1-TSV4 structures 610(1)-610(4) may be implemented in TSVs included in the TSV columns 332, 334, 336, 338 of the core chips 0-7 342(0)-(7) of FIGS. 3-5. In some examples, the TSV structures 710(1)-710(4) may be implemented in TSVs included in the TSV columns 333, 335, 337, 339 of the core chips 0-7 342(0)-(7) of FIGS. 3-5. As shown in FIG. 6, the each of the TSV 1-TSV4 structures 610(1)-610(4) may penetrate through the silicon substrate 680, an interlayer insulating film 681, which is provided on a front surface of the silicon substrate 680, and a passivation film 683, which is provided on a back surface of the silicon substrate 680. The TSV1-TSV4 structures 610(1)-610(4) are not particularly limited to, but are formed of Cu (copper). The front surface (the upper-side surface in FIG. 6) of the silicon substrate 680 is a device formation surface on which devices such as transistors are formed. Insulating rings 682 are provided around each of the TSV1-TSV4 structures 610(1)-610(4), thereby ensuring insulation between each of the TSV1-TSV4 structures 610(1)-610(4) and the transistor region. In the example shown in FIG. 6, the insulating rings 682 are doubly provided, thereby reducing the electrostatic capacity between each of the TSV1-TSV4 structures 610(1)-610(4) and the silicon substrate 680. The insulating rings 682 may be single instead of being double. Moreover, in place of providing insulating rings 682, insulating sidewalls may be provided on the surface of TSV1-TSV4 of the TSV1-TSV4 structures 610(1)-610(4) with no insulating rings.

An end part of each of the TSV1-TSV4 structures 610(1)-610(4) in the back surface side of the silicon substrate 680 is covered with the back-surface bump BB. The BB bump may contact a corresponding front-surface bump FB of an adjacent core chip or interface chip, such as the core chips 0-7 342(0)-(7) or the interface chip 310/interface chip 510 of FIGS. 3-5. The back-surface bumps BB are not particularly limited to, but are formed of SnAg solder covering the surface of the penetrating electrodes TSV1.

Insulating layers corresponding to five layers including the above described interlayer insulating film 681 are formed on the front surface of the silicon substrate 680. The uppermost layer thereof is a passivation film 684. On the front surfaces of the layers excluding the passivation film 684, wiring layers L1 to LA are sequentially formed from the side that is closer to the front surface of the silicon substrate 680. The wiring layers L1 to L4 are comprised of pads M1 to M4, respectively. Among them, the pad M1 is in contact with the end part of the penetrating electrode TSV1 that is in the front surface side of the silicon substrate 680. In the layers excluding the interlayer insulating film 81 and the passivation film 684, a plurality of through-hole electrodes TH1 to TH3 are provided sequentially from the side that is close to the front surface of the silicon substrate 680, thereby mutually connecting the pads M1 to M4.

The front-surface bump FB is connected to the pad M4 via a pillar part 686, which is penetrating through the passivation film 684. Therefore, the front-surface bump FB is connected to the end part of each of the TSV1-TSV4 structures 610(1)-610(4) via the pillar part 686, the pads M to M4, and the through-hole electrodes TH1 to TH3. The front-surface bumps FB are in contact with the back-surface bumps BB of an adjacent core chip or interface chip, such as the core chips 0-7 342(0)-(7) or the interface chip 310/interface chip 510 of FIGS. 3-5. The front-surface bumps FB are in contact with the substrate electrode 691 on the interposer IP. The front-surface bump FB is not particularly limited, but has the pillar part 686 formed of Cu (copper). The surface of the pillar part 686 has a stacked structure of Ni (nickel) and Au (gold). The diameters of the front-surface bumps FB and the back-surface bumps BB are about 20 µm.

The front surface of the passivation film 684 is covered with a polyimide film 85 excluding the region in which the front-surface bump FB is formed. The connection with internal circuits not shown is established via internal wiring (not shown) extended from the pads M1 to M3 provided in the wiring layers L1 to L3.

In this manner, each of the TSV1-TSV4 structures 610(1)-610(4) are connected to the front-surface bump FB and the back-surface bump BB provided at the same position of the same chip in the planar view. Since each of the TSV1-TSV4 structures 610(1)-610(4) are commonly connected to the core chips, each of the TSV 1-TSV4 structures 610(1)-610(4) may be used as, for example, power supply paths.

Referring to FIG. 7, the TSV1-TSV4 structures 710(1)-710(4) may include elements that have been previously described with respect to the TSV1-TSV4 structures 610(1)-610(4) of FIG. 6. Those elements have been identified in FIG. 7 using the same reference numbers used in FIG. 6 and operation of the common elements is as previously described. Consequently, a detailed description of the operation of these particular elements will not be repeated in the interest of brevity. As shown in FIG. 7, each of the TSV1-TSV4 structures 710(1)-710(4) are not provided with the through-hole electrode TH2, which connects the pad M2 and the pad M3 at the same planar position. Therefore, the front-surface bump FB and the back-surface bump BB at the same planar position are not short-circuited with each other. Rather, the front-surface bump FB of the TSV1 structure 710(1) is connected to the back-surface bump BB of the TSV2 structure 710(2), the front-surface bump FB of the TSV2 structure 710(2) is connected to the back-surface bump BB of the TSV3 structure 710(3), the front-surface bump FB of the TSV3 structure 710(3) is connected to the back-surface bump BB of the TSV4 structure 710(4), and the front-surface bump FB of the TSV4 structure 710(4) loops back to connect to the back-surface bump BB of the TSV1 structure 710(1) via an intermediate buffer 788. While the intermediate buffer 788 is shown as unidirectional, the intermediate buffer 788 may be bi-directional. The intermediate buffer 788 may be implemented in any of the intermediate buffers 362(0)-362(7) of FIGS. 3-5. Regarding the other points, the TSV1-TSV4 structures 710(1)-710(4) and the TSV1-TSV4 structures 610(1)-610(4) have the same structure.

Each of the TSV1-TSV4 structures 710(1)-710(4) are spirally connected so that they are used, for example, in a case in which an interface chip and a core chip are individually connected.

Figure 8:
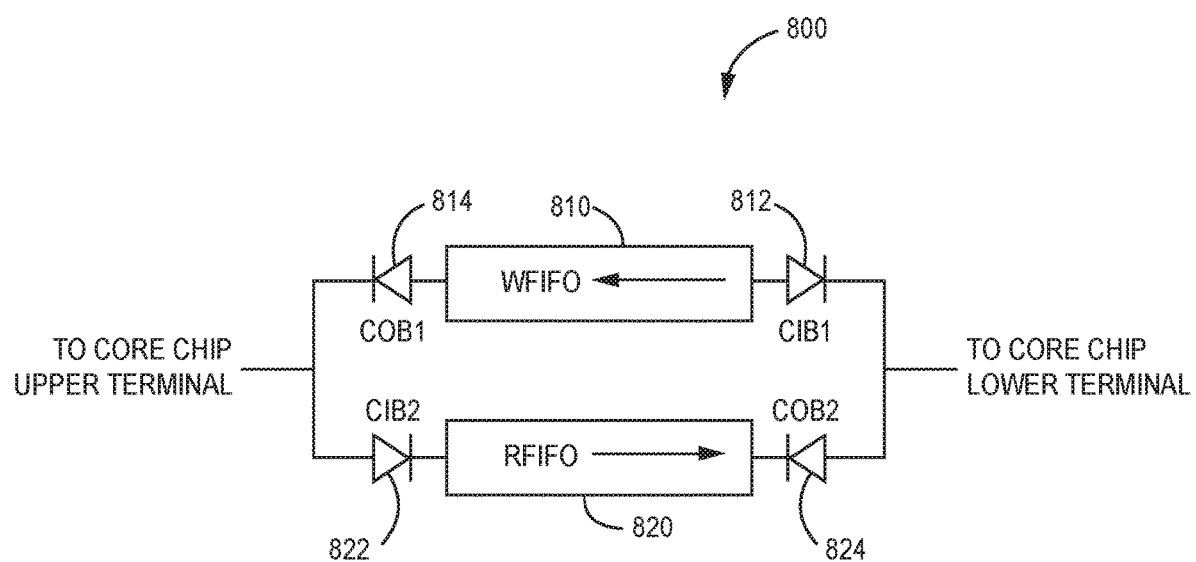
FIG. 8 is a block diagram of an intermediate buffer according to an embodiment of the disclosure.

FIG. 8 is a block diagram of an intermediate buffer 800 according to an embodiment of the disclosure. The intermediate buffer 800 may include a write first in, first out (WFIFO) 810 configured to propagate data in a first direction and a read first in, first out (RFIFO) 820 configured to propagate data in a second direction. The intermediate buffer 800 may be implemented in any of the intermediate buffers 362(0)-362(7) of FIGS. 3-5 and/or the intermediate buffer 788 of FIG. 7.

A first input buffer 812 is provided at an input of the WFIFO 810 and a first output buffer 814 is provided at an output of the WFIFO 810. A second input buffer 822 is provided at an input of the RFIFO 820 and a second output buffer 824 is provided at an output of the RFIFO 820. The first input buffer 812 is activated to pass data to the WFIFO 810 in response to a first input buffer control signal CIB1 and the first output buffer 814 is activated to pass data from the WFIFO 810 in response to a first output buffer control signal COB1. The second input buffer 822 is activated to pass data to the RFIFO 820 in response to a second input buffer control signal CIB2 and the second output buffer 824 is activated to pass data from the RFIFO 820 in response to a second output buffer control signal COB2. Each of the WFIFO 810 and the RFIFO 820 are FIFO circuits having a first-in/first-out function.

During normal operation, the CIB1/2 and the COB1/2 may be selectively activated to propagate data or signals through the intermediate buffer 800 from a core chip lower terminal to a core chip upper terminal or from a core chip upper terminal to a core chip lower terminal. During testing, the CIB1/2 and the COB1/2 may remain deactivated to prevent propagation of any data or signals through the intermediate buffer 800.

Figure 9:
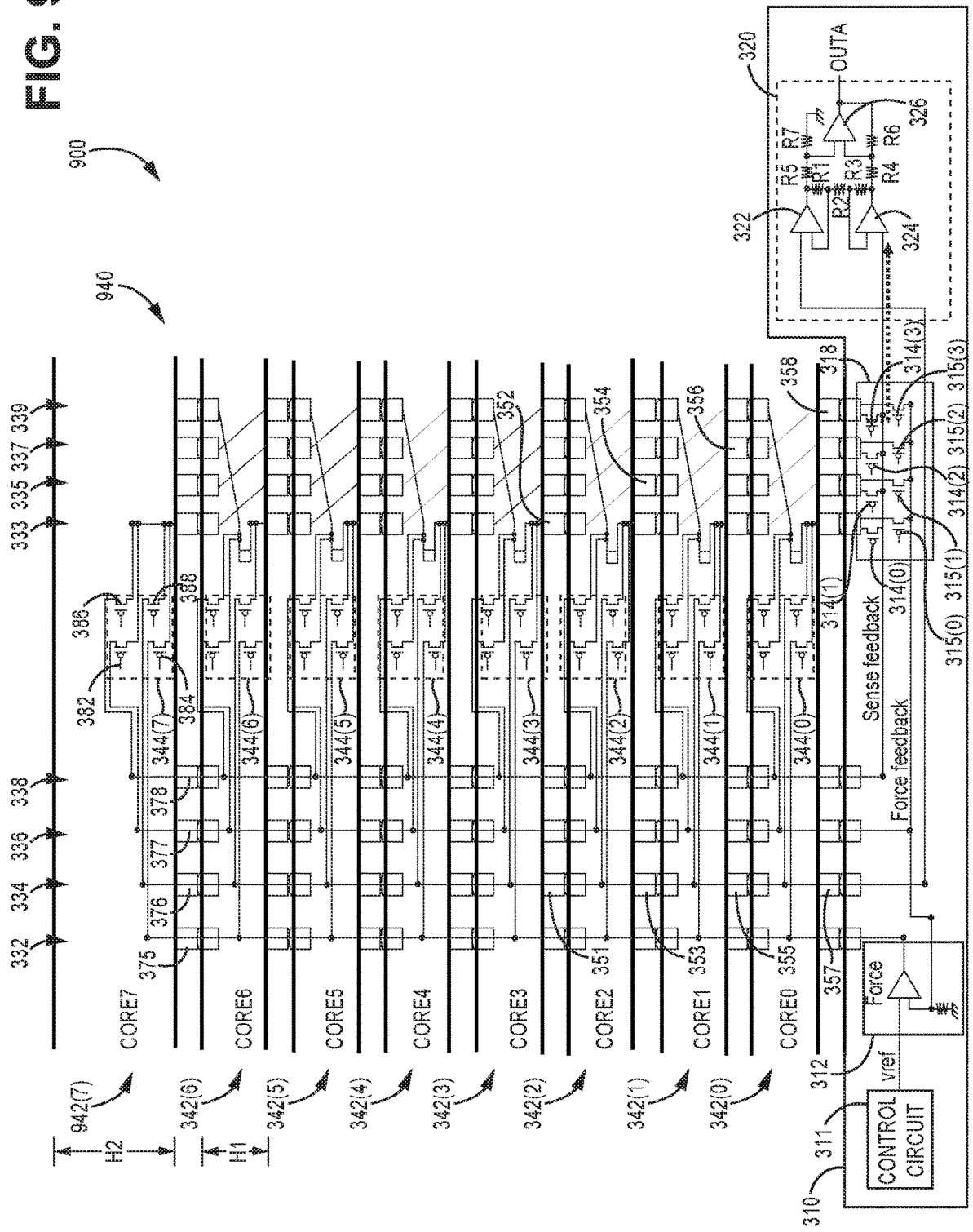
FIG. 9 is a schematic illustration of an apparatus including a stacked semiconductor device in accordance with embodiments of the disclosure.

FIG. 9 is a schematic illustration of an apparatus 900 including a stacked semiconductor device in accordance with embodiments of the disclosure. The apparatus 900 may include elements that have been previously described with respect to the apparatus 300 of FIG. 3. Those elements have been identified in FIG. 9 using the same reference numbers used in FIG. 3 and operation of the common elements is as previously described. Consequently, a detailed description of the operation of these particular elements will not be repeated in the interest of brevity.

Figure 10A:
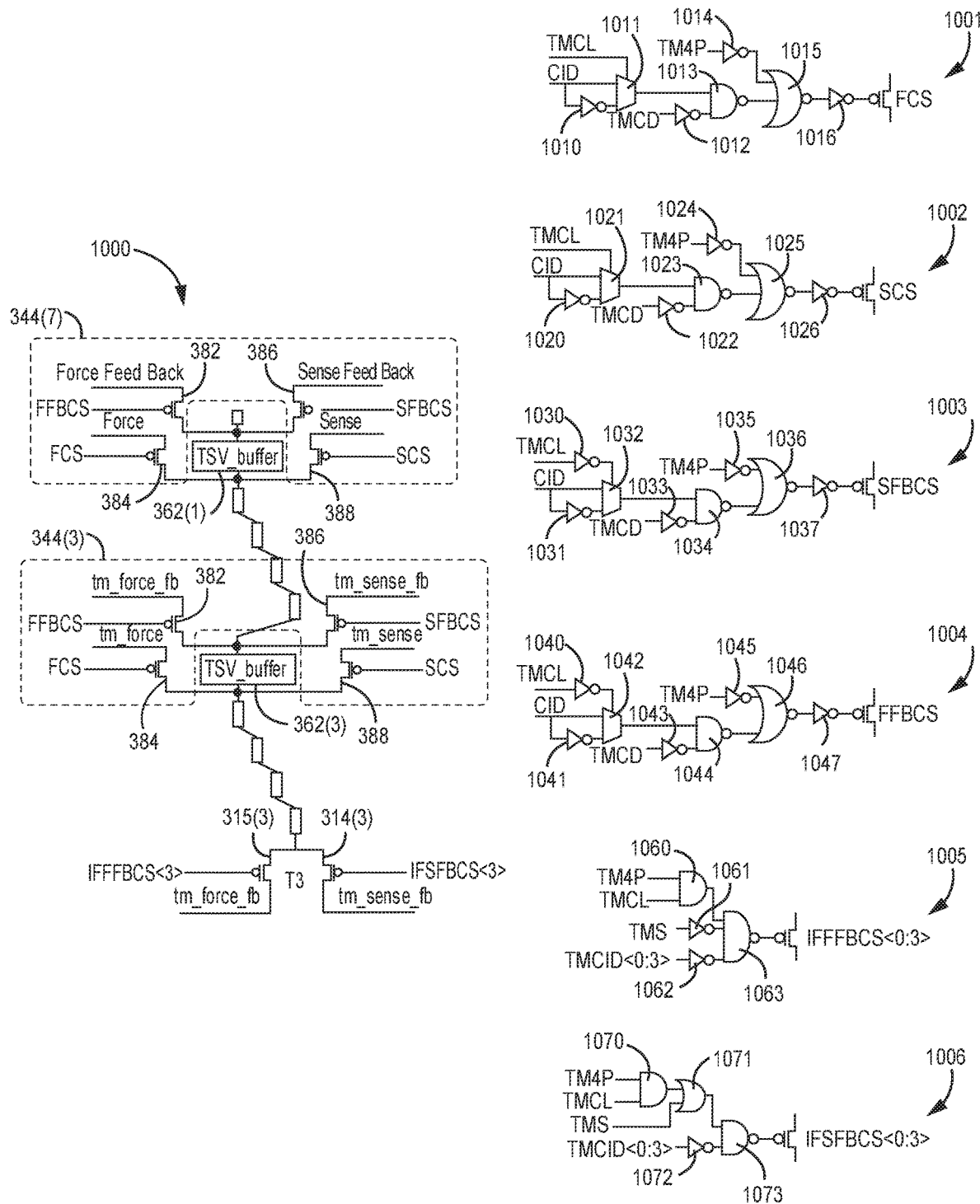
FIG. 10A is a schematic diagram of a stacked semiconductor device and logic circuits for providing control signals in accordance with embodiments of the disclosure.

The apparatus 900 may include a stacked semiconductor device 940 having the core chips 0-6 342(0)-342(6) and a core chip 7 942(7) stacked on top of the core chip 6 342(6). In contrast to the core chip 7 362(7) of FIGS. 3-5, the core chip 7 942(7) has a height H2 that is greater than the height H1 of others of the core chips 0-6 362(0)-362(6). The core chip 7 942(7) is also without the upper terminals 371-374 and 391-394 and the intermediate buffer 362(7). Otherwise, the core chip 7 962(7) operates similarly to the core chip FIG. 10A is a schematic diagram of a stacked semiconductor device 1000 and logic circuits 1001-1006 for providing control signals in accordance with embodiments of the disclosure. The stacked semiconductor device 1000 may include elements that have been previously described with respect to the apparatus 300 of FIG. 3. Those elements have been identified in FIG. 10 using the same reference numbers used in FIG. 3 and operation of the common elements is as previously described. Consequently, a detailed description of the operation of these particular elements will not be repeated in the interest of brevity. The logic circuits 1001-1006 may be implemented in a control circuit, such as the control circuit 311 of FIGS. 3, 4, and 9, the control circuit 511 of FIG. 5, or combinations thereof.

The force feedback transistor 382 of the control circuitry 344(3) and 344(7) may receive a force feedback control signal FFBCS at a gate to control the force feedback transistor 382 to provide the force feedback signal, the force transistor 384 of the control circuitry 344(3) and 344(7) may receive a force control signal FCS at a gate to control the force transistor 384 to provide the force signal, the sense feedback transistor 386 of the control circuitry 344(3) and 344(7) may receive a sense feedback control signal SFBCS at a gate to control the sense feedback transistor 386 to provide the sense feedback signal, and the sense transistor 388 of the control circuitry 344(3) and 344(7) may receive a sense control signal SCS at a gate to control the sense transistor 388 to provide the sense signal. The sense feedback transistor 314(3) may receive the interface chip sense feedback control signal IFSFBCS <3> at a gate to control the sense feedback transistor 314(3) to provide the sense feedback signal. The force feedback transistor 315(3) may receive the interface chip force feedback control signal IFFFBCS<3> at a gate to control the force feedback transistor 314(3) to provide the force feedback signal. For the sense feedback transistors 314(0)-314(2) of FIGS. 3-5, IFSFBCS <0:2> signals may be provided to control provision of the sense feedback signal. For the force feedback transistors 315(0)-314(2) of FIGS. 3-5, IFFFBCS <0:2> signals may be provided to control provision of the force feedback signal.

The logic circuit 1001 may include components 1010-1016 (e.g., inverter 1010, multiplexer 1011, inverter 1012, NAND gate 1013, inverter 1014, NOR gate 1015, and inverter 1016) to control a value of the FCS control signal based on a lower core test mode signal TMCL (e.g., whether an upper or lower core chip is being tested, such as core chips 0-3 342(0)-342(3) or core chips 4-7 342(4)-342(7)), a core chip identifier signal CID (e.g., testing which of core chips 0-7), a non-targeted core disable signal TMCD (e.g., disabling non-targeted cores during an operation), and a four port test mode signal TM4P (e.g., indicates testing for resistance through the terminals as described with reference to FIGS. 3 and 4).

The logic circuit 1002 may include components 1020-1026 (e.g., inverter 1020, multiplexer 1021, inverter 1022, NAND gate 1023, inverter 1024, two input NOR gate 1025, and inverter 1026) to control a value of the SCS control signal based on the TMCL signal, the CID signal, the TMCD signal, and the TM4P signal.

The logic circuit 1003 may include components 1030-1037 (e.g., inverter 1030, inverter 1031, multiplexer 1032, inverter 1033, NAND gate 1034, inverter 1035, NOR gate 1036, and inverter 1037) to control a value of the FFBCS control signal based on the TMCL signal, the CID signal, the TMCD signal, and the TM4P signal.

The logic circuit 1004 may include components 1041-1047 (e.g., inverter 1040, inverter 1041, multiplexer 1042, inverter 1043, NAND gate 1044, inverter 1045, and NOR gate 1046, and inverter 1047) to control a value of the SFBCS control signal based on the TMCL signal, the CID signal, the TMCD signal, and the TM4P signal.

The logic circuit 1005 may include components 1060-1063 to control a value of the IFFFBCS<0:3> control signals based on the TMCL signal, a core group selection signal <0:3> signal TMCID<0:3> (e.g., selection of amplifiers associated with an access of a core chip block, such as setting the TMCID signal for core chips 0-3 342(0)-342(3) while set to a first value and setting the TMCID signal for core chips 4-7 342(4)-342(7) while set to a second value), the TMS signal, and the TM4P signal.

The logic circuit 1006 may include components 1070-1073 to control a value of the IFSFBCS<0:3> control signals based on the TMCL signal, the TMCID<0:3> signal, the TMS signal, and the TM4P signal.

Figure 10B:
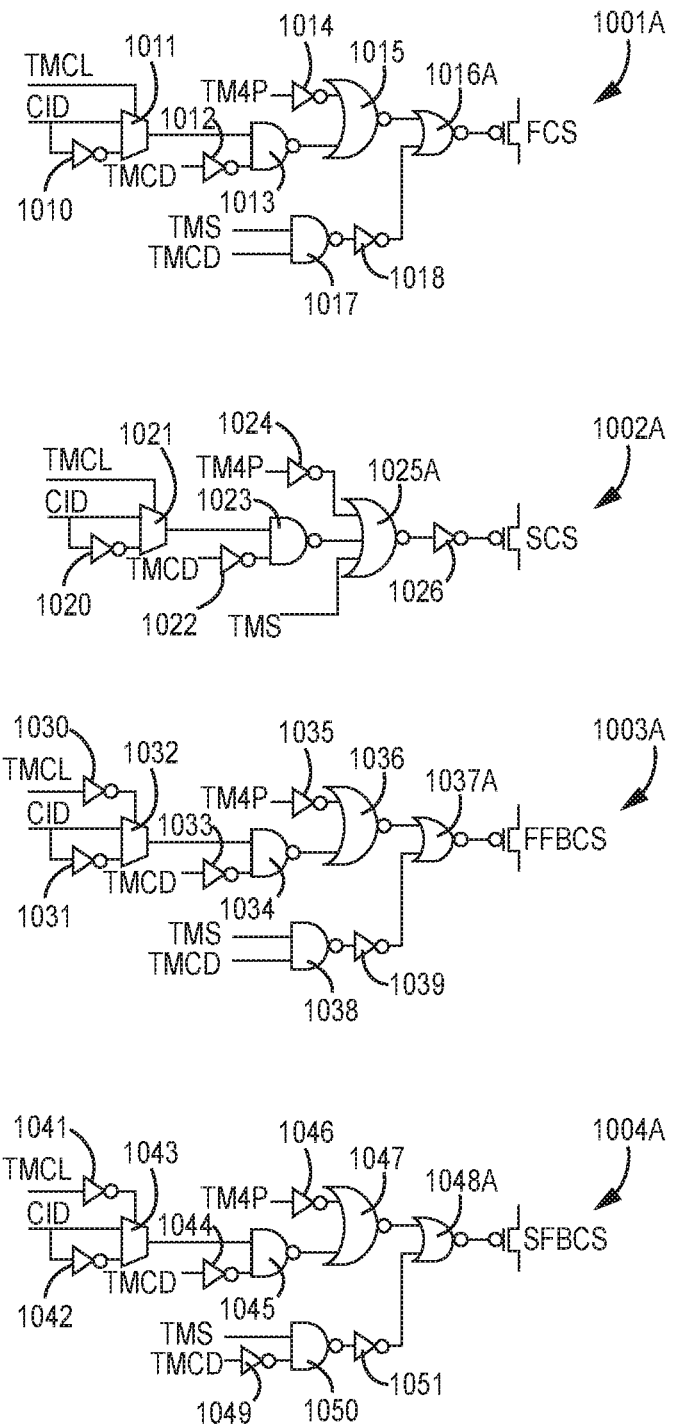
FIG. 10B is a schematic diagram of alternative logic circuits for providing control signals in accordance with embodiments of the disclosure.

FIG. 10B is a schematic diagram of alternative logic circuits 1001A-1006A for providing control signals in accordance with embodiments of the disclosure. The stacked logic circuits 1001A-1004A may include elements that have been previously described with respect to the logic circuits 1001-1004 of FIG. 10A. Those elements have been identified in FIG. 10B using the same reference numbers used in FIG. 10A and operation of the common elements is as previously described. Consequently, a detailed description of the operation of these particular elements will not be repeated in the interest of brevity. The logic circuits 1001A-1004A may be implemented in a control circuit, such as the control circuit 311 of FIGS. 3, 4, and 9, the control circuit 511 of FIG. 5, or combinations thereof.

The logic circuit 1001A may include components 1010-1015, 1016A, 1017, and 1018 (e.g., including NOR gate 1016A, NAND gate 1017, and inverter 1018) to control a value of the FCS control signal based on the TMCL signal, the CID signal, the TMCD signal, a short test mode signal TMS (e.g., indicates testing for electrical shorts between adjacent terminals as described with reference to FIG. 5), and the TM4P signal.

The logic circuit 1002A may include components 1020-1024, 1025A, and 1026 (e.g., including three input NOR gate 1025A) to control a value of the SCS control signal based on the TMCL signal, the CID signal, the TMCD signal, the TMS signal, and the TM4P signal.

The logic circuit 1003A may include components 1030-1036, 1037A, 1038, and 1039 (e.g., including NOR gate 1037A, NAND gate 1038, and inverter 1039) to control a value of the FFBCS control signal based on the TMCL signal, the CID signal, the TMCD signal, the TMS signal, and the TM4P signal.

The logic circuit 1004A may include components 1041-1047, 1048A, and 1049-1051 (e.g., including NOR gate 1048A, inverter 1049, NAND gate 1050, and inverter 1051) to control a value of the SFBCS control signal based on the TMCL signal, the CID signal, the TMCD signal, the TMS signal, and the TM4P signal.

FIG. 11 is an exemplary table of values of the control signals based on the logic circuits 1001-1006 of FIG. 10 in accordance with embodiments of the disclosure. The column 1110 shows exemplary control signals for a resistance test upper, an example of which is illustrated and described with reference to FIG. 4. The column 1112 shows exemplary control signals for a resistance test lower, an example of which is illustrated and described with reference to FIG. 3. The column 1114 shows exemplary control signals for a short test, an example of which is illustrated and described with reference to FIG. 5.

From the foregoing it will be appreciated that, although specific embodiments of the present disclosure have been described herein for purposes of illustration, various modifications may be made without deviating from the spirit and scope of the present disclosure.

What is claimed is:

1. A method comprising:
providing a force signal from a force signal driver circuit to a first terminal of a first chip of a stacked semiconductor device via a first switch on the first chip;
coupling a sense circuit to the first terminal via a second switch on the first chip to provide a sense signal;
coupling the sense circuit to a second terminal on a second chip of the stacked semiconductor device to provide a sense feedback signal;
sensing impedance between the first terminal and the second terminal based on the sense signal and the sense feedback signal;
coupling the force signal driver circuit to the second terminal on the second chip of the stacked semiconductor device to provide a force feedback signal; and
adjusting the force signal based on the force feedback signal.

2. The method of claim 1, wherein coupling the force signal driver circuit to the second terminal on the second chip of the stacked semiconductor device comprises enabling a third switch on the second chip.

3. The method of claim 1, wherein the first chip is separated from the second chip by at least one other chip of the stacked semiconductor device.

4. The method of claim 1, wherein the first terminal is along a first through-substrate via (TSV) column of the stacked semiconductor device and the second terminal is along a second TSV column of the stacked semiconductor device.

5. The method of claim 1, further comprising:
providing a first control signal to the first switch to couple the force signal driver circuit to the first terminal; and
providing a second control signal to the second switch to couple the second terminal to the sense circuit.

6. A method comprising:
providing a force signal from a force signal driver circuit to a first terminal of a first chip of a stacked semiconductor device via a first switch on the first chip;
coupling a second terminal of the first chip to a low supply voltage source via a second switch, wherein a voltage of the force signal is greater than a voltage of the low supply voltage source; and
detecting an electrical short between adjacent terminals of at least one chip of the semiconductor device based on whether a voltage of the second terminal exceeds a reference voltage between the voltage of the low supply voltage source and the voltage of the force signal.

7. The method of claim 6, further comprising:
in response to the voltage of the second terminal being greater than the reference voltage, detecting the electrical short between at least two of the adjacent terminals of the at least one chip of the semiconductor device; and
in response to the voltage of the second terminal being less than the reference voltage, detecting that the adjacent terminals of the chips of the semiconductor device are electrically isolated.

8. The method of claim 6, further comprising providing a second force signal to a third terminal of the first chip via a second switch on the first chip contemporaneous with provision of the force signal.

9. The method of claim 8, wherein the force signal and the second force signal have a same voltage.

10. The method of claim 8, wherein the first terminal is along a first through-substrate via (TSV) column of the stacked semiconductor device and the second terminal and the third terminal are each along a second TSV column of the stacked semiconductor device.

11. The method of claim 10, wherein the third terminal is coupled to a terminal of an adjacent chip that is along a third TSV column of the stacked semiconductor device.

12. The method of claim 6, further comprising providing the force signal to the first switch via a third terminal of the first chip.

13. The method of claim 6, further comprising enabling the first and second switches.

14. The method of claim 6, the second switch is located on an interface chip of the stacked semiconductor device.

15. A method comprising:
sensing an impedance through a first conductive path of between a first terminal of a top chip of a subset of chips of a stacked semiconductor device and a second terminal of a bottom chip of the subset of chips of the stacked semiconductor device by:
providing a force signal to a first terminal of a top chip of the subset of chips of a stacked semiconductor device via a first switch on the first chip;
sensing impedance along the first path based on a voltage difference between a voltage at the second terminal and a feedback voltage provided along a second propagation path from the first terminal to a third terminal of the bottom chip, wherein the first terminal is along a first through-substrate via (TSV) column of the stacked semiconductor device and the second terminal is along a second TSV column of the stacked semiconductor device.

16. The method of claim 15, further comprising enabling a second switch of the first chip to form the second propagation path.

17. The method of claim 15, further comprising coupling the second terminal and the third terminal to a sense circuit to the second terminal on the second chip of the stacked semiconductor device comprises enabling a third switch on the second chip.

18. The method of claim 15, wherein the subset of chips of the stacked semiconductor device includes more than two chips.

* * * * *